(12) United States Patent
Nome Silva et al.

(10) Patent No.: US 10,505,534 B2
(45) Date of Patent: Dec. 10, 2019

(54) HIGH VOLTAGE LOW CURRENT ENABLE PIN STARTUP CIRCUIT

(71) Applicant: TEXAS INSTRUMENTS INCORPORATED, Dallas, TX (US)

(72) Inventors: Faruk Jose Nome Silva, Sunnyvale, CA (US); Tawen Mei, Sunnyvale, CA (US); Karen Chan, South San Francisco, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/843,089

(22) Filed: Dec. 15, 2017

(65) Prior Publication Data

US 2018/0294807 A1   Oct. 11, 2018

Related U.S. Application Data

(60) Provisional application No. 62/482,587, filed on Apr. 6, 2017.

(51) Int. Cl.

| H02M 3/335 | (2006.01) |
| H03K 5/08 | (2006.01) |
| H02M 3/156 | (2006.01) |
| H02J 1/14 | (2006.01) |
| H02J 7/00 | (2006.01) |
| H03K 17/68 | (2006.01) |
| H04N 5/357 | (2011.01) |
| H03M 1/36 | (2006.01) |
| H03K 17/22 | (2006.01) |

(52) U.S. Cl.
CPC ............. *H03K 17/223* (2013.01); *H03K 5/08* (2013.01)

(58) Field of Classification Search
CPC ........ H03K 17/223; H03K 5/08; H02M 3/158
USPC ........................................ 327/142, 143, 198
See application file for complete search history.

(56) References Cited

U.S. PATENT DOCUMENTS 9,111,187 B2 * 8/2015 Cho ................... G06K 19/0723
9,647,557 B2 * 5/2017 Milanesi ............. H02M 3/1584
(Continued)

FOREIGN PATENT DOCUMENTS

WO      2007014461 A1     2/2007

OTHER PUBLICATIONS

PCT Search Report for Application No. PCT/US 2018/025792, dated Jul. 12, 2018.

*Primary Examiner* — Brandon S Cole
(74) *Attorney, Agent, or Firm* — Andrew Viger; Charles A. Brill; Frank D. Cimino

(57) ABSTRACT

An integrated circuit includes an enable circuit and a main circuit. The enable circuit is configured to receive a supply voltage and an enable signal at a first voltage level, generate a start voltage by clamping the supply voltage to a threshold voltage level that is less than the supply voltage and generate an enable intermediate signal at a second voltage level that is less than the first voltage level and limited by the start voltage. In response to the enable intermediate signal being generated at the second voltage level, the enable circuit is configured to generate a start signal (such as a current). In response to the start signal being generated, the enable circuit is configured to generate an output signal at a third voltage level that is less than the first voltage level. The main circuit is configured to utilize the output signal as a supply voltage rail.

21 Claims, 4 Drawing Sheets

(56) References Cited

U.S. PATENT DOCUMENTS

| | | | |
|---|---|---|---|
| 9,673,696 B2* | 6/2017 | Lu | H02M 1/36 |
| 10,075,075 B2* | 9/2018 | Zhang | H02M 3/1582 |
| 2011/0285369 A1 | 11/2011 | Cuk | |
| 2013/0119962 A1 | 5/2013 | Holmberg et al. | |
| 2014/0184285 A1* | 7/2014 | Dunipace | H02M 1/36 |
| | | | 327/143 |
| 2015/0229215 A1 | 8/2015 | Choudhary | |
| 2017/0272072 A1* | 9/2017 | Okushima | H03K 19/003 |
| 2017/0346469 A1* | 11/2017 | El-Nozahi | H03K 5/08 |
| 2018/0026440 A1* | 1/2018 | Zhao | H02H 9/046 |

* cited by examiner

HIGH VOLTAGE LOW CURRENT ENABLE PIN STARTUP CIRCUIT

CROSS-REFERENCE TO RELATED APPLICATIONS

The present application claims priority to U.S. Provisional Patent Application No. 62/482,587, filed Apr. 6, 2017, titled "High Voltage Low Current Enable Pin Startup Circuit," which is hereby incorporated herein by reference in its entirety.

BACKGROUND

In many wide input voltage integrated circuits, an enable signal received through an enable terminal of an integrated circuit provides an indication that the integrated circuit is to power on and run. For example, once the enable terminal receives a HIGH enable signal, enable circuitry processes the enable signal so that the integrated circuit starts operating. In many cases, the resulting signal is the positive power rail for the integrated circuit. Typically, the enable circuitry is rated at a high voltage (e.g., at the same voltage level as the supply voltage which is usually much higher than standard complementary-oxide-semiconductor (CMOS) voltage levels) so that it can be conveniently tied to the supply voltage. Because, in many systems, the enable signal is a relatively high voltage signal (e.g., 60 V, 12 V, etc.), it must be converted to a signal that is based off of a much lower voltage rail (e.g., 5 V, 3.3 V, etc.). Therefore, it is necessary to convert, utilizing the enable circuitry, the high voltage enable signal to a lower voltage to be processed by the integrated circuit.

SUMMARY

In accordance with aspects of the disclosure, an integrated circuit includes an enable circuit and a main circuit. The enable circuit is configured to receive a supply voltage and an enable signal at a first voltage level. The first voltage level corresponds to the supply voltage. The enable circuit is also configured to generate a start voltage by clamping the supply voltage to a threshold voltage level that is less than the supply voltage and generate an enable intermediate signal at a second voltage level that is less than the first voltage level and limited by the start voltage. In response to the enable intermediate signal being generated at the second voltage level, the enable circuit is configured to generate a start current. In response to the start current being generated, the enable circuit is configured to generate an output signal at a third voltage level that is less than the first voltage level. The main circuit is configured to utilize the output signal as a supply voltage rail.

According to another aspect of the disclosure, an enable circuit includes an enable terminal, an input terminal, a clamp, and a first switch. The enable terminal is configured to receive an enable signal at a first voltage level. The input terminal is configured to receive a supply voltage. The clamp is configured to receive the supply voltage and generate a start voltage by clamping the supply voltage to a threshold voltage level that is less than the supply voltage. The first switch is coupled to the enable terminal and configured to be closed by the start voltage. The enable signal is configured to pass through the first switch when the first switch is closed to generate an enable intermediate signal at a second voltage level. The second voltage level is limited by the start voltage.

According to another aspect of the disclosure, a method for generating a voltage rail for an integrated circuit includes receiving a supply voltage and an enable signal at a first voltage level. The first voltage level corresponds to the supply voltage. The method also includes clamping the supply voltage to a threshold voltage level that is less than the supply voltage to generate a start voltage. The method also includes passing the enable signal through a first switch to generate an enable intermediate signal at a second voltage level that is less than the first voltage level. The method also includes limiting the second voltage level with the start voltage. The method also includes, in response to the enable intermediate signal being generated at the second voltage level, generating a start current. The method also includes, in response to the start current being generated, generating an output signal at a third voltage level that is less than the first voltage level.

BRIEF DESCRIPTION OF THE DRAWINGS

For a detailed description of various examples, reference will now be made to the accompanying drawings in which.

NOTATION AND NOMENCLATURE

Figure 1:
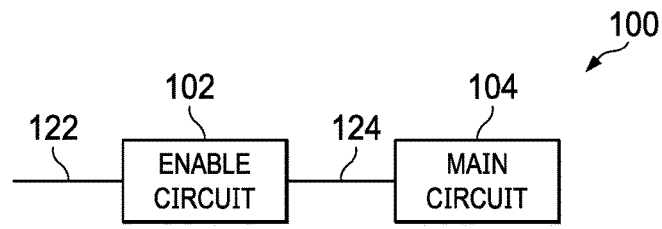
FIG. 1 shows an illustrative block diagram of an integrated circuit in accordance with various examples.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various disclosed examples. Although one or more of these example implementations may be preferred, the examples disclosed should not be interpreted, or otherwise used, as limiting the scope of the disclosure, including the claims. In addition, one skilled in the art will understand that the following description has broad application, and the discussion of any example is meant only to be exemplary of that example, and not intended to intimate that the scope of the disclosure, including the claims, is limited to that example.

Many wide input voltage integrated circuits include enable circuitry that, once an enable signal is received, converts the voltage of the enable signal to a lower voltage to be processed by the integrated circuit, in some cases, as a positive voltage rail for the integrated circuit. For example, an enable signal may be received at 60 V or 12 V. The VCC (the positive power rail) of the integrated circuit may be 5 V or 3.3 V. Therefore, the enable signal is reduced from 60 V or 12 V to 5 V or 3.3 V to provide power to the remainder of the integrated circuit and thus, enable operation of the integrated circuit. The enable circuitry that is used in some systems to convert the higher enable signal to the lower VCC voltage typically requires an input current be drawn by the enable circuitry even after the integrated circuit has been enabled.

Enable circuitry can include an enable terminal connected to a clamp in series with a high impedance to limit the current. Thus, the current flowing from the enable terminal is equal to the enable signal voltage received at the enable terminal minus the clamp voltage divided by the impedance. Therefore, the current into the enable terminal increases with the enable signal voltage. To limit that current, the impedance needs to be relatively high (e.g., as much as 57 MΩ to limit the current to 1 µA). To implement such a large impedance, a large area on the chip is required. Hence, there is a need for enable circuitry that reduces current draw through the enable terminal without requiring a large area.

In accordance with various examples, an enable circuit is disclosed that includes two follower switches in parallel connected to the enable terminal. A start voltage (VSTART) which is generated by a clamp from the supply voltage drives one of the switches closed. Once a high voltage enable signal is received, it is passed through the closed switch as an enable intermediate signal. However, the start voltage acts to regulate the enable intermediate signal because once the voltage of the enable intermediate signal becomes too high (e.g., is greater than the voltage of the start voltage minus the threshold voltage of the closed switch), the closed switch will open until the voltage of the enable intermediate signal drops to a lower level (e.g., is less than the voltage of the start voltage minus the threshold voltage of the switch) at which time the switch will close again. The enable intermediate signal, in conjunction with the start voltage, causes a start signal (e.g., a current ISTART) to be generated by an LDO startup circuit which causes an internal LDO to generate an output signal (VCC for an integrated circuit). The output signal may be used to drive the second of the two parallel switches causing that switch to close. Because it is a follower switch, the output signal acts to regulate the enable intermediate signal in a similar manner as the other switch is regulated by the start voltage. At the same time, the start voltage is pulled to ground and the first switch (the switch controlled by the start voltage) opens. Because the start voltage is pulled to ground, the LDO startup circuit stops generating the start signal. In this way, little to no current is drawn by the enable terminal.

FIG. 1 shows an illustrative block diagram of an integrated circuit 100 in accordance with various examples. The integrated circuit 100 includes, in an example, an enable circuit 102 and a main circuit 104. The enable circuit 102 is configured to receive an enable signal 122 and generate an output signal 124. The enable signal 122 is an analog signal that has a relatively high voltage that is tied to a supply voltage. For example, if the supply voltage providing power to the integrated circuit 100 is 60 V, the enable signal 122 can be 60 V when HIGH, or if the supply voltage is 12 V, the enable signal can be 12 V when HIGH. Because the enable signal 122 is at a relatively high voltage level, the enable circuit is configured to convert the enable signal 122 into a signal, the output signal 124, that is based on a lower voltage rail (e.g., 5 V, 3.3 V, etc.). For example, the enable circuit 102 can receive the enable signal 122 at 60 V and convert the voltage into output signal 124 at 3.3 V.

The output signal 124 is then received by main circuit 104. The main circuit 104 is one or more circuits within the integrated circuit 100 that performs the main functions of the integrated circuit 104. For example, if the main circuit 104 is digital signal processor (DSP), the main circuit 104 can implement the hardware signal processing function of the DSP. In some examples, the output signal 124 acts as the VCC for the main circuit 104 (e.g., the supply rail for the low voltage logic and analog circuits within the integrated circuit 100). Therefore, the output signal 124 can provide a power supply to the main circuit 104.

Figure 2:
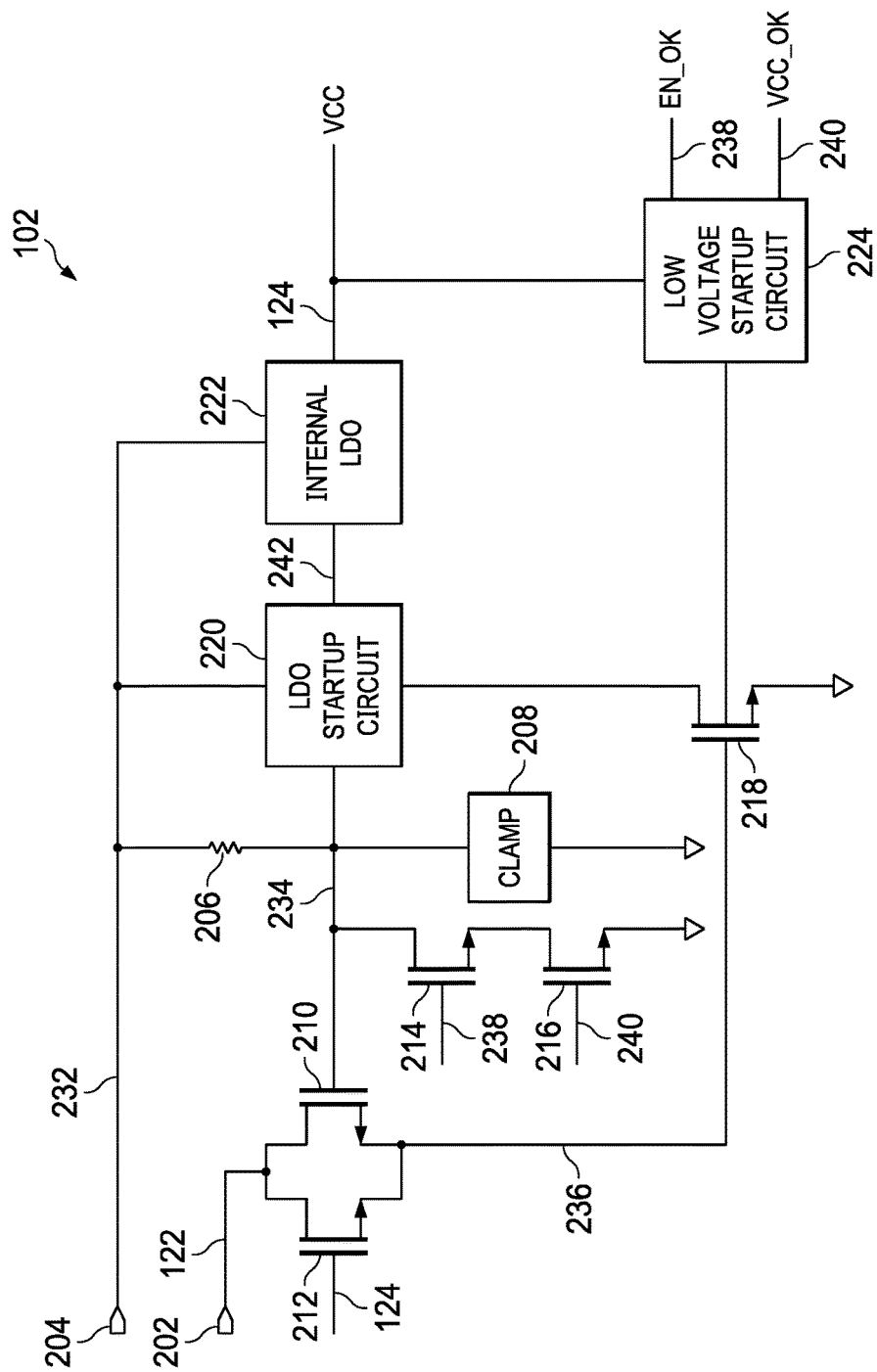
FIG. 2 shows an illustrative block diagram of an enable circuit of an integrated circuit in accordance with various examples.

FIG. 2 shows an illustrative block diagram of enable circuit 102 of integrated circuit 100 in accordance with various examples. The enable circuit 102 includes, in an example, the enable terminal 202, input terminal 204, resistive element 206, clamp 208, switches 210-218, LDO startup circuit 220, internal LDO 222, and low voltage startup circuit 224. The switches 210-218 are, in an example, n-channel metal-oxide-semiconductor field-effect transistors (NMOS transistors). However, in other examples, the switches 210-218 can be any type of switch (e.g., p-channel metal-oxide-semiconductor field-effect transistors (PMOS transistors), bipolar junction transistors (BJTs), etc.).

The input terminal 204 is configured to receive the supply voltage 232 which, as discussed above, is at a relatively high voltage level (e.g., 60 V, 12 V, etc.). The supply voltage 232 provides power to the enable circuit 102. The resistive element 206, which in some examples is a resistor and/or a junction gate field-effect transistor (JFET), etc., provides an impedance to the high voltage of the supply voltage 232. The clamp 208 receives the supply voltage 232 and binds the upper and/or lower extreme of the waveform that comprises the supply voltage 232 to a fixed direct current (DC) voltage level. In some examples, the clamp 208 is configured to clamp the supply voltage 232 to two times the VGS (threshold voltage) of the switch 210. The resulting signal, shown as VSTART 234 (the start voltage), is always present in the enable circuit 102 prior to the enable circuit 102 receiving the enable signal 122. VSTART 234 is connected to the gate of switch 210, and thus, controls the switch 210.

The enable terminal 202 is configured to receive the enable signal 122, which as discussed above, can be at the same voltage level of the supply voltage 232. In some examples, the enable terminal 202 is connected to the switches 210 and 212 and more particularly to the drains of switches 210 and 212. Because VSTART 234 provides a voltage greater than the threshold voltage of switch 210, the switch 210 is closed at all times prior to the receipt, by enable terminal 202, of the enable signal 122. Once the enable signal 122 is received by the enable terminal 202, the enable signal 122 passes through the closed switch 210 as enable intermediate signal 236. However, the voltage of enable intermediate signal 236 is limited by VSTART 234 while VSTART 234 is on because once the voltage 236 raises to a level that is higher than VSTART 234 minus the threshold voltage of switch 210, switch 210 opens. Once the voltage of the enable intermediate signal 236 drops below a level equal to VSTART 234 minus the threshold voltage of switch 210, switch 210 closes. This process keeps repeating itself while the enable signal 122 and VSTART 234 are HIGH. Thus, the voltage of enable intermediate signal 236 is limited to VSTART 234 minus the switch 210 threshold voltage while VSTART 234 is on.

More particularly, switch 210 is, in an example, a follower transistor. Therefore, if the voltage of enable signal 122 drops below or is lower than VSTART 234, the source of switch 210 follows the drain, thus the voltage of enable intermediate signal 236 equals the voltage of enable signal 122 while the voltage of enable signal 122 is lower than VSTART 234. However, if the voltage of enable signal 122 raises above the voltage at the source of switch 210, as discussed above, the voltage of enable intermediate signal 236 is limited to VSTART 234 minus the threshold voltage of switch 210 while VSTART 234 is on. Because there is no path to ground, no current is drawn by the enable terminal 202 except for leakage current.

In an example, the gate of switch 218 is connected to the sources of switches 210 and 212. Thus, prior to the receipt of enable signal 122, the switch 218 is open. However, once the enable signal 122 passes through switch 210 as enable intermediate signal 236, switch 218 closes. Thus, a terminal of a resistor within the LDO startup circuit 220 is pulled to ground. The LDO startup circuit 220 utilizes VSTART 234 in conjunction with the pulled to ground resistor and a follower transistor to generate a signal, in this example a current, labelled ISTART 242. ISTART 242 is received by the internal LDO 222. The internal LDO 222 utilizes ISTART 242 to generate the output signal 124, in some examples, at the voltage level of VCC (e.g., 5 V, 3.3 V, etc.).

Because ISTART 242 is not needed once the output signal 124 is at the voltage level of VCC, ISTART 242 is shut down after the output signal 124 goes HIGH. The low voltage startup circuit 224 is configured, in an example, to receive the enable intermediate signal 236 and the output signal 124. Once the enable intermediate signal 236 is received at the low voltage startup circuit 224, an EN_OK signal 238 is generated by the low voltage startup circuit 224 (e.g., a HIGH signal 238). Furthermore, once the voltage in the output signal 124 reaches VCC, the low voltage startup circuit 224 is configured to generate a VCC_OK signal 240 (e.g., a HIGH signal 240). The switch 214 can be controlled by the signal 238 while the switch 216 can be controlled by the signal 240. Therefore, once the signal 238 is HIGH, switch 214 closes, and once the signal 240 is HIGH, switch 216 closes. Once both switches 214 and 216 close, VSTART 234 is pulled to ground. Because VSTART 234 is pulled to ground, ISTART 242, which is generated by LDO startup circuit 220 utilizing VSTART 234 and enable intermediate signal 236, is shut down. This lowers the current draw in the enable circuit 102.

The output signal 124 is configured to drive the gate of switch 212 which is connected in parallel with switch 210. Therefore, at the same time that VSTART 234 is pulled to ground and opens switch 210, switch 212 becomes the main follower device as it is closed. While switch 212 is the main follower device by being closed while switch 210 is open, it functions similar to how switch 210 functions when closed. Thus, the enable signal 122 passes through the closed switch 212 as enable intermediate signal 236. However, the voltage of enable intermediate signal 236 is limited by the output signal 124 (VCC) because once the voltage 236 raises to a level that is higher than the voltage of the output signal 124 minus the threshold voltage of switch 212, switch 212 opens. Once the voltage of the enable intermediate signal 236 drops below a level equal to the voltage of output signal 124 minus the threshold voltage of switch 212, switch 212 closes. This process keeps repeating itself while the enable signal 122 and output signal 124 are HIGH. Thus, the voltage of enable intermediate signal 236 is limited to the voltage of the output signal 124 minus the threshold voltage of switch 212 while switch 212 is closed. Because there is no path to ground, no current is drawn by the enable terminal 202 except for leakage current.

In this way, the enable circuit 102 is able to translate a high voltage enable signal into a lower voltage output signal (e.g., VCC) while drawing zero or little current (e.g., 1 nA) without requiring a large area on the chip.

Figure 3:
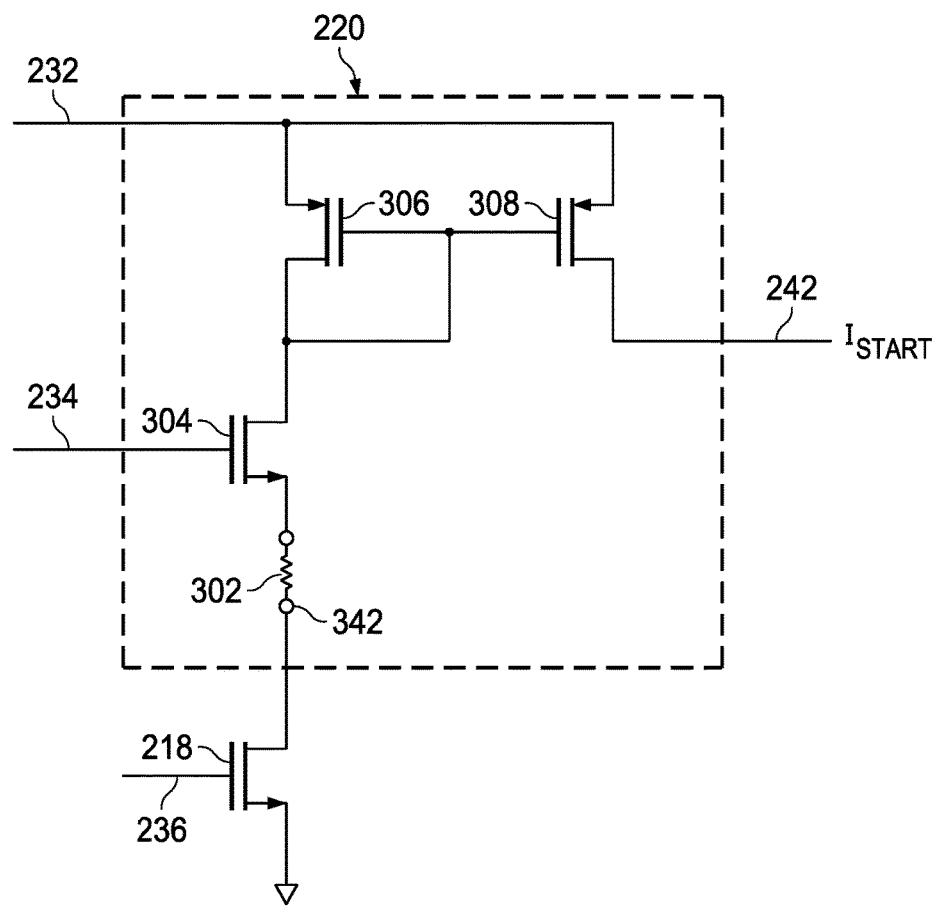
FIG. 3 shows an illustrative circuit diagram for a low dropout (LDO) startup circuit of an enable circuit in accordance with various examples.

FIG. 3 shows an illustrative circuit diagram for LDO startup circuit 220 of enable circuit 102 in accordance with various examples. The LDO startup circuit 220 includes, in an example, resistor 302 and transistors 304-308. In an example, transistor 304 is an NMOS transistor. In alternative examples, the transistor 304 can be any type of transistor (e.g., PMOS transistor, BJT, etc.). In an example, transistors 306 and 308 are PMOS transistors. In alternative examples, the transistors 306 and 308 can be any type of transistor (e.g., NMOS transistors, BJTs, etc.).

As discussed above, as the enable intermediate signal 236 transitions HIGH, the switch 218 closes. This pulls terminal 342 of resistor 302 to ground. Additionally, VSTART 234, which is HIGH, closes transistor 304. Because transistors 306-308 act as a follower device, a current source is created which generates ISTART 242.

Figure 4:
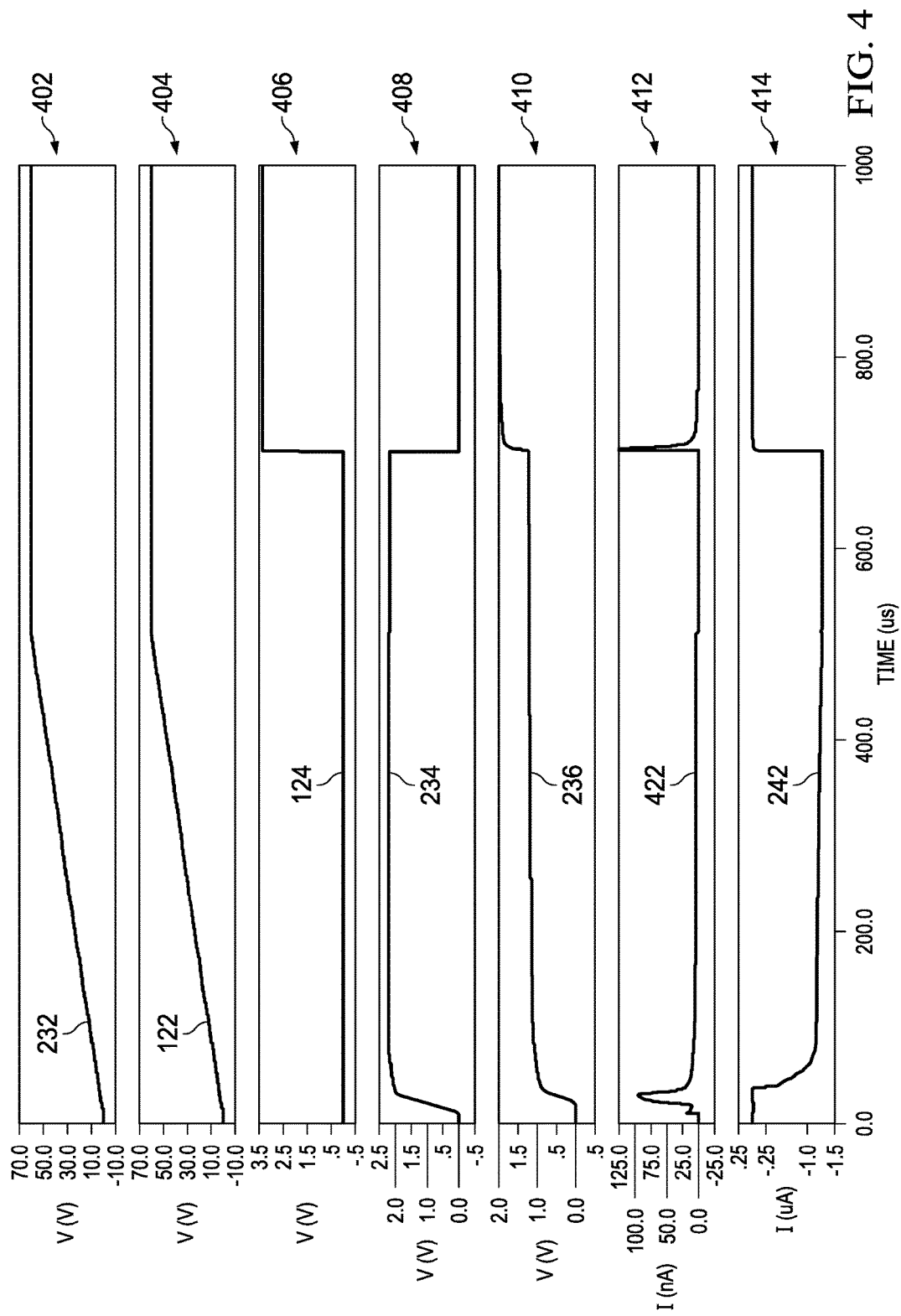
FIG. 4 shows illustrative graphs showing transient response of various signals in an enable circuit in accordance with various examples.

FIG. 4 shows illustrative graphs 402-414 showing transient response of various signals in enable circuit 102 in accordance with various examples. Graph 402 is an example voltage versus time graph of the supply voltage 232 received at input terminal 204. In the example shown in graph 402, the supply voltage ramps up to 60 V over approximately 500 μs. Graph 404 is an example voltage versus time graph of the enable signal 122 received at the enable terminal 202. Similar to the supply voltage 232 shown in graph 402, in the example shown in graph 404, the voltage of the enable signal 122 ramps up to 60 V over approximately 500 μs.

Graph 406 is an example voltage versus time graph of the output signal 124 (e.g., VCC) output from internal LDO 222 and received by the switch 124. As shown in the example graph 406, the voltage of the output signal 124 is LOW until approximately 700 μs at which time it transitions HIGH (approximately 3.3 V in the example). Thus, in this example it takes approximately 200 μs from the receipt of the enable signal 122 for the enable circuit 102 to generate the HIGH output signal 124.

Graph 408 is an example voltage versus time graph of VSTART 234 which is generated by clamp 208 from the supply voltage 232. As shown in the example graph 408, VSTART 234 clamps to a reference voltage of approximately 2.2 V as soon as the supply voltage 232 reaches the clamp voltage reference level. VSTART 234 remains at 2.2 V until the output signal 124 transitions HIGH. Once the output signal 124 transitions HIGH, the low voltage startup circuit 224 generates a HIGH signal 238 (due to the enable intermediate signal 236) and HIGH signal 240 (due to the HIGH output signal 124). The HIGH signal 238 closes switch 214 while the HIGH signal 240 closes switch 216 causing VSTART 234 to be pulled to ground. Thus, as shown in graph 408, at approximately 700 μs, VSTART 234 drops to zero.

Graph 410 is an example voltage versus time graph of the enable intermediate signal 236 which flows from either the switch 210 or 212. As shown in the example graph 410, the voltage of enable intermediate signal 236 rises as the voltage of the enable signal 122 rises. However, the voltage of the enable intermediate signal 236 is limited by VSTART 234 to VSTART 234 minus the threshold voltage of the switch 210. Thus, the voltage of the enable intermediate signal 236 remains at approximately 1 V until the output signal 124 transitions HIGH. Once the output signal 124 transitions HIGH, as discussed above, VSTART 234 is pulled to ground causing the switch 210 to open. The output signal 124 drives the gate of switch 212 to close. Thereafter, the voltage of the enable intermediate signal 236 rises as the voltage of the enable signal is higher than 1 V. However, the voltage of the enable intermediate signal 236 is limited by the voltage of the output signal 124 to the voltage of the output signal 124 minus the threshold voltage of the switch 212. Thus, the voltage of the enable intermediate signal 236 from time 700 µs (the time that the output signal 124 transitions HIGH) on is approximately 2 V.

Graph 412 is an example current versus time graph of the current being drawn by the enable terminal 202 (labelled as current 422). As shown in the example graph 412, the current 422 spikes as the enable signal 122 is received by the enable terminal 202 and the voltage on enable intermediate signal 236 is brought up. However, as the voltage on enable intermediate signal 236 stabilizes, the current 422 drops to approximately zero. In some examples there is still some leakage current in the enable terminal 202, therefore the current 422 can be relatively small value above zero (e.g., 1 nA). As the voltage of enable intermediate signal 236 rises when switch 212 closes, another current spike can occur in current 422. However, again, as the voltage of enable intermediate signal 236 stabilizes, the current 422 drops to approximately zero or to a relatively small value above zero (e.g., 1 nA) due to leakage current.

Graph 414 is an example current versus time graph of ISTART 242 which is generated by the LDO startup circuit 220. As shown in the example graph 414, ISTART 242 begins at 0 A, but begins to be generated by the LDO startup circuit 220 because enable intermediate signal 236 closes the switch 218 and draws the terminal 342 of resistor 302 to ground. Once, the output signal 124 voltage is HIGH, VSTART 234 is pulled to ground which stops ISTART 242 (e.g., drops ISTART to 0 A).

Therefore, as shown in graphs 402-414, the enable circuit 102 prevents relatively high currents from being drawn by the enable terminal 202. In other words, the enable circuit 102 allows negligible current from being drawn by a high voltage enable terminal 202.

Figure 5:
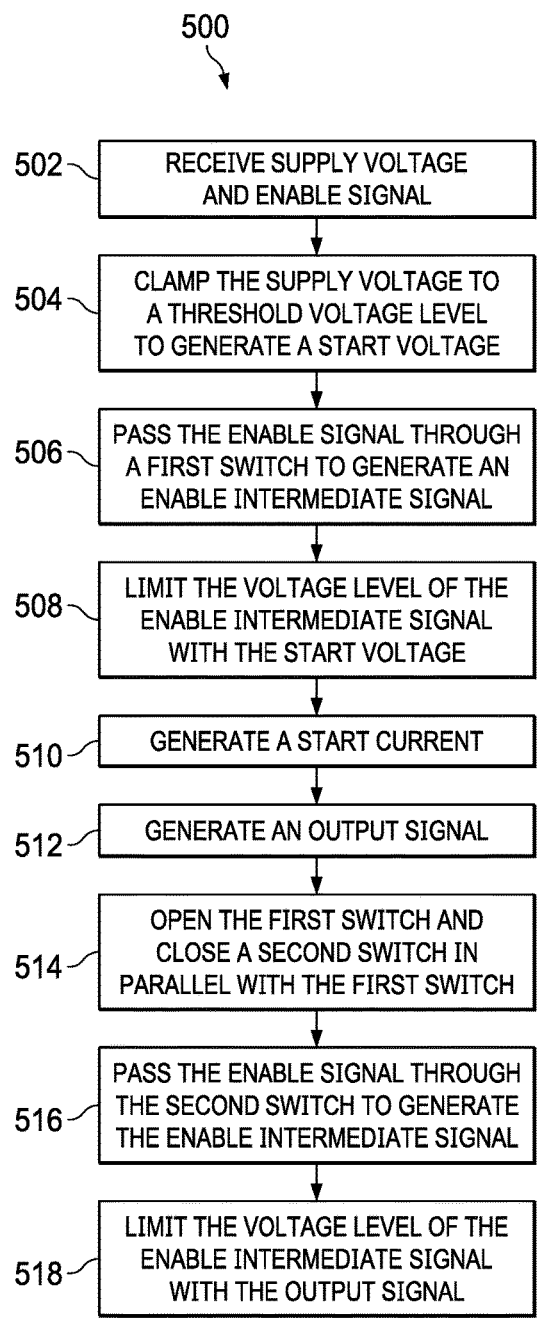
FIG. 5 shows an illustrative flow diagram of a method for generating a voltage rail for an integrated circuit in accordance with various examples.

FIG. 5 shows an illustrative flow diagram of a method 500 for generating a voltage rail for an integrated circuit in accordance with various examples. Though depicted sequentially as a matter of convenience, at least some of the actions shown can be performed in a different order and/or performed in parallel. Additionally, some examples may perform only some of the actions shown. In some examples, at least some of the operations of the method 500, as well as other operations described herein, are performed by the enable circuit 102 (including the enable terminal 202, the input terminal 204, the resistive element 206, the clamp 208, the switch 210, the switch 212, the switch 214, the switch 216, the switch 218, the LDO startup circuit 220, the internal LDO 222, and/or the low voltage startup circuit 224) and implemented in logic.

The method 500 begins in block 502 with receiving a supply voltage and an enable signal. For example, the input terminal 202 can be configured to receive supply voltage 232 which may be at a relatively high voltage (e.g., 60 V or 12 V). The enable terminal 204 can be configured to receive the enable signal 122 at a voltage level that corresponds to the supply voltage 232 (e.g., the enable signal 122 can be at a voltage that is equal or approximately equal to the voltage of the supply voltage 232). In block 504, the method 500 continues with clamping the supply voltage to a threshold voltage level to generate a start voltage. For example, clamp 208 can clamp the supply voltage 232 to a threshold voltage level (e.g., 2 times the threshold voltage of switch 210) which is less than the supply voltage 232 to generate VSTART 234.

The method 500 continues in block 506 with passing the enable signal through a first switch to generate an enable intermediate signal. For example, VSTART 234 can control switch 210 such that switch 210 is closed when the enable signal 122 is received by the enable terminal 202. Therefore, the enable signal 122 passes through switch 210 to generate enable intermediate signal 236. In block 508, the method 500 continues with limiting the voltage level of the enable intermediate signal with the start voltage. For example, because the switch 210 is a follower, if the voltage of the enable intermediate signal 236 rises to a level that is greater than VSTART 234 minus the threshold voltage of switch 210, switch 210 opens. Once the voltage in the enable intermediate signal 236 falls below VSTART 234 minus the threshold voltage of switch 210, switch 210 will close again. In this way, the voltage of enable intermediate signal 236 is regulated at a much lower voltage than the voltage of enable signal 122.

The method 500 continues in block 510 with generating a start signal, in this example a start current. For example, the LDO startup circuit 220 can generate ISTART 242 utilizing VSTART 234 and the closing of switch 218 by the enable intermediate signal 236. In block 512, the method 500 continues with generating an output signal. For example, the output signal 124 can be generated by internal LDO utilizing ISTART 242. The output signal 124 can then be utilized as a supply rail for main circuit 104.

The method 500 continues in block 514 with opening the first switch and closing a second switch that is in parallel with the first switch. For example, the gate of switch 212 can be connected to the internal LDO 222 and configured to receive the output signal 124. Therefore, once a HIGH output signal 124 is generated, the switch 124 closes. At the same time, the low voltage startup circuit generates the EN_OK signal 238 indicating that a HIGH enable intermediate signal 236 has been generated and the VCC_OK signal 240 indicating a HIGH output signal 124 has been generated. The switch 214 closes in response to receiving the signal 238, and the switch 216 closes in response to receiving the signal 240. Once both switches 214 and 216 close, VSTART is drawn to ground and switch 210 opens.

In block 516, the method 500 continues with passing the enable signal through the second switch to generate the enable intermediate signal. For example, because switch 212 closes, the enable signal 122 passes through switch 212 to generate the enable intermediate signal 236. The method 500 continues in block 518 with limiting the voltage level of the enable intermediate signal with the output signal. For example, because the switch 212 is a follower, if the voltage of the enable intermediate signal 236 rises to a level that is greater than the voltage of the output signal 124 minus the threshold voltage of switch 212, switch 212 opens. Once the voltage in the enable intermediate signal 236 falls below the voltage of the output signal 124 minus the threshold voltage of switch 212, switch 212 will close again. Therefore, the voltage of enable intermediate signal 236 is regulated at a much lower voltage than the voltage of enable signal 122. In this way a voltage rail (e.g., output signal 124) for an integrated circuit is generated while the enable terminal draws little to no current.

The above discussion is meant to be illustrative of the principles and various examples according to the present disclosure. Numerous variations and modifications will become apparent to those skilled in the art once the above disclosure is fully appreciated. It is intended that the following claims be interpreted to embrace all such variations and modifications.

What is claimed is:

1. An integrated circuit, comprising:
clamp circuitry to receive a supply voltage, and to generate a start voltage clamped to a voltage less than the supply voltage;
an enable circuit to receive an enable signal, and to generate an enable-intermediate signal; and
VCC output circuitry to generate, in response to the start voltage and the enable-intermediate signal, an output voltage VCC less than the supply voltage;
the enable circuit including:
first and second transistors connected in a parallel follower configuration, with connected common terminals coupled to receive the enable signal, and connected output terminals to provide the enable-intermediate signal;
the first transistor controlled by the start voltage;
the second transistor controlled by VCC; and
the enable-intermediate signal clamped to voltage corresponding to one of the start voltage by the first transistor, or VCC by the second transistor.

2. The integrated circuit of claim 1, wherein:
in response to the enable signal and the start voltage, the first transistor is closed, to pass the enable signal through the first transistor to generate the enable intermediate signal clamped to the start voltage.

3. The integrated circuit of claim 2, wherein:
in response to the enable signal and VCC, the second transistor is closed, to pass the enable signal through the second transistor to generate the enable intermediate signal clamped to VCC.

4. The integrated circuit of claim 3, wherein:
the enable circuit is further configured to open the first transistor, in response in part to the generation of VCC, the second transistor switch controlled by VCC to control the enable intermediate signal.

5. The integrated circuit of claim 1, wherein the enable circuit further includes:
startup control circuitry to receive VCC and the enable-intermediate signal, and to generate at least one of an enable-valid signal indicating the enable signal is valid and a VCC-valid signal indicating VCC is valid; and
in response to at least one of the enable-valid signal and the VCC-valid signal, to pull the start voltage to ground, to open the first transistor.

6. The integrated circuit of claim 5, wherein:
the startup control circuitry generates the enable-valid signal and the VCC-valid signal; and
the enable circuit further includes:
a third transistor controlled by the enable-valid signal; and
a fourth transistor controlled by the VCC-valid signal; the third and fourth transistor coupled in series between the clamp circuitry and ground.

7. The integrated circuit of claim 5, wherein:
the LDO startup circuit is configured to stop generating the start signal in response to pulling the start voltage to ground.

8. The integrated circuit of claim 1, the VCC output circuitry including:
a low dropout (LDO) startup circuit coupled to the clamp circuit, the LDO startup circuit configured to generate, in response in part to the enable-intermediate signal, an LDO start signal; and
an LDO circuit coupled to the LDO startup circuit, the LDO circuit configured to generate, in response to receiving the LDO start signal, the output voltage VCC.

9. The enable circuit of claim 1, wherein the first and second transistors are n-channel metal-oxide-semiconductor field-effect transistors (MOSFETs).

10. An integrated circuit, comprising:
main circuitry configured for operation with a generated voltage VCC; and
enable circuitry coupled to the main circuitry, and configured to receive a supply voltage and an enable signal, and to generate VCC less than the supply voltage, the enable circuitry including:
clamp circuitry to generate a start voltage clamped to a voltage less than the supply voltage;
an enable circuit to receive the enable signal, and to generate an enable-intermediate signal; and
VCC output circuitry to generate, in response to the start voltage and the enable-intermediate signal, VCC, the VCC output circuitry including:
a low dropout (LDO) startup circuit coupled to the clamp circuit, the LDO startup circuit configured to generate, in response in part to the enable-intermediate signal, an LDO start signal; and
an LDO circuit coupled to the LDO startup circuit, the LDO circuit configured to generate, in response to receiving the LDO start signal, the output voltage VCC.;
the enable circuit including:
first and second transistors connected in a parallel follower configuration, with connected common terminals coupled to receive the enable signal, and connected output terminals to provide the enable-intermediate signal,
the first transistor controlled by the start voltage,
the second transistor controlled by VCC, and
the enable-intermediate signal clamped to voltage corresponding to one of the start voltage by the first transistor, or VCC by the second transistor.

11. The integrated circuit of claim 10, wherein:
in response to the enable signal and the start voltage, the first transistor is closed, to pass the enable signal through the first transistor to generate the enable intermediate signal clamped to the start voltage.

12. The integrated circuit of claim 11, wherein:
in response to the enable signal and VCC, the second transistor is closed, to pass the enable signal through the second transistor to generate the enable intermediate signal clamped to VCC.

13. The integrated circuit of claim 12, wherein:
the enable circuit is further configured to open the first transistor, in response in part to the generation of VCC, the second transistor switch controlled by VCC to control the enable intermediate signal.

14. The integrated circuit of claim 10, wherein the enable circuit further includes:
  startup control circuitry to receive VCC and the enable-intermediate signal, and to generate at least one of an enable-valid signal indicating the enable signal is valid and a VCC-valid signal indicating VCC is valid; and
  in response to at least one of the enable-valid signal and the VCC-valid signal, to pull the start voltage to ground, to open the first transistor.

15. The integrated circuit of claim 14, wherein:
  the startup control circuitry generates the enable-valid signal and the VCC-valid signal; and
  the enable circuit further includes:
    a third transistor controlled by the enable-valid signal; and
    a fourth transistor controlled by the VCC-valid signal;
    the third and fourth transistors coupled in series between the clamp circuitry and ground.

16. The integrated circuit of claim 10, wherein the first and second transistors are n-channel metal-oxide-semiconductor field-effect transistors (MOSFETs).

17. The integrated circuit of claim 10, wherein:
  the LDO startup circuit is configured to stop generating the start signal in response to pulling the start voltage to ground.

18. A method for use in an integrated circuit with main circuitry operable with a voltage VCC less than a supply voltage, and enable circuitry to generate VCC in response to an enable signal, the method comprising:
  generating a start voltage clamped to a voltage less than the supply voltage;
  generating an enable-intermediate signal based at least in part on the enable signal; and
  generating VCC in response to the start voltage and the enable-intermediate signal;
  the enable-intermediate signal generated by first and second transistors connected in a parallel follower configuration, with connected common terminals coupled to receive the enable signal, and connected output terminals to provide the enable-intermediate signal, including
    controlling the first transistor by the start voltage,
    controlling the second transistor by VCC, and
    clamping the enable-intermediate signal to a voltage corresponding to one of the start voltage by the first transistor, or VCC by the second transistor.

19. The method of claim 18, wherein:
  in response to the enable signal and the start voltage, the first transistor is closed, to pass the enable signal through the first transistor to generate the enable intermediate signal clamped to the start voltage; and
  in response to the enable signal and VCC, the first transistor is opened and the second transistor is closed, to pass the enable signal through the second transistor to generate the enable intermediate signal clamped to VCC.

20. The method of claim 18, wherein:
  generating, in response VCC and the enable-intermediate signal, at least one of an enable-valid signal indicating the enable signal is valid and a VCC-valid signal indicating VCC is valid; and
  in response to at least one of the enable-valid signal and the VCC-valid signal, pulling the start voltage to ground, to open the first transistor.

21. The method of claim 18; wherein:
  VCC is generated by a low dropout (LDO) circuit and an LDO startup circuit;
  the LDO startup circuit to generate, in response in part to the enable-intermediate signal, an LDO start signal; and
  the LDO circuit to generate, in response to receiving the LDO start signal, the output voltage VCC.

* * * * *